（12）United States Patent
Chien et al.

(10) Patent No.: US 10,777,775 B2
(45) Date of Patent: Sep. 15, 2020

(54) FLEXIBLE DISPLAY DEVICE AND METHOD FOR MAKING SAME

(71) Applicant: HON HAI PRECISION INDUSTRY CO., LTD., New Taipei (TW)

(72) Inventors: Liang-Neng Chien, New Taipei (TW); Yi-Hsiang Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 3 days.

(21) Appl. No.: 15/657,308

(22) Filed: Jul. 24, 2017

(65) Prior Publication Data

US 2018/0040858 A1 Feb. 8, 2018

Related U.S. Application Data

(60) Provisional application No. 62/371,826, filed on Aug. 7, 2016.

(51) Int. Cl.
| | |
|---|---|
| *H01L 51/56* | (2006.01) |
| *H01L 27/32* | (2006.01) |
| *H01L 51/00* | (2006.01) |
| *H01L 51/52* | (2006.01) |
| *H01L 51/50* | (2006.01) |

(52) U.S. Cl.
CPC .......... *H01L 51/56* (2013.01); *H01L 27/3244* (2013.01); *H01L 51/003* (2013.01); *H01L 51/0097* (2013.01); *H01L 51/5012* (2013.01); *H01L 51/524* (2013.01); *H01L 51/5206* (2013.01); *H01L 51/5221* (2013.01); *H01L 51/52* (2013.01); *H01L 2227/326* (2013.01); *H01L 2251/301* (2013.01); *H01L 2251/5338* (2013.01); *Y02E 10/549* (2013.01)

(58) Field of Classification Search
CPC .................. H01L 31/03926; H01L 2251/5338
See application file for complete search history.

(56) References Cited

U.S. PATENT DOCUMENTS

| | | | | | |
|---|---|---|---|---|---|
| 5,324,683 | A | * | 6/1994 | Fitch | .................... G01P 15/0802 148/DIG. 73 |
| 5,534,466 | A | * | 7/1996 | Perfecto | .............. H01L 21/4857 156/250 |
| 6,355,125 | B1 | * | 3/2002 | Tahon | ............... B32B 17/10036 156/265 |
| 7,754,042 | B2 | * | 7/2010 | Dalvey | ................ B41M 5/0256 156/235 |
| 9,623,633 | B2 | * | 4/2017 | Kim | ........................ H01L 51/52 |

(Continued)

FOREIGN PATENT DOCUMENTS

CN 104505467 A 4/2015

*Primary Examiner* — Edward Chin
(74) *Attorney, Agent, or Firm* — ScienBiziP, P.C.

(57) ABSTRACT

A method for making a flexible display device includes: providing a hard substrate and sequentially forming a sacrificial layer, a metal layer, a buffer layer, and a flexible layer on the hard substrate; forming a display element layer on a surface of the flexible layer away from the buffer layer; hot pressing a laminate formed by the display element layer, the flexible layer, the buffer layer, the metal layer, the sacrificial layer, and the hard substrate to make the display element layer to bond to the flexible layer; laser irradiating the laminate from a side of the hard substrate to make the metal layer and the sacrificial layer peel off from each other.

11 Claims, 7 Drawing Sheets

(56) References Cited

U.S. PATENT DOCUMENTS

| | | | |
|---|---|---|---|
| 9,748,521 B2* | 8/2017 | Kachatryan | H01L 51/5256 |
| 2013/0273292 A1* | 10/2013 | Kim | B32B 37/18 |
| | | | 428/40.1 |
| 2014/0345791 A1* | 11/2014 | Son | H01L 51/0024 |
| | | | 156/228 |
| 2015/0188082 A1* | 7/2015 | Rohatgi | H01L 25/048 |
| | | | 257/40 |
| 2015/0200312 A1* | 7/2015 | Watanabe | H01L 31/032 |
| | | | 136/256 |
| 2016/0111683 A1 | 4/2016 | Kachatryan et al. | |
| 2017/0332179 A1* | 11/2017 | Bright | H04R 23/002 |
| 2018/0040858 A1* | 2/2018 | Chien | H01L 51/56 |
| 2018/0130913 A1* | 5/2018 | Watanabe | H01L 31/03925 |

* cited by examiner

FLEXIBLE DISPLAY DEVICE AND METHOD FOR MAKING SAME

FIELD

The subject matter herein generally relates to a flexible display device and a method for making the flexible display device.

BACKGROUND

A flexible display device is useful and convenient. The flexible display device generally includes a flexible substrate and a display element layer formed on the flexible substrate. A method for making the flexible display device generally includes the following steps: forming a flexible substrate (e.g. polyimide substrate) on a hard support (e.g. glass support); then forming a display element layer on the flexible substrate; and finally removing the hard support. The hard support is configured to support the flexible substrate and the display element layer only during the process of making the flexible substrate. It is important to peel off the flexible substrate from the hard support completely.

BRIEF DESCRIPTION OF THE DRAWINGS

Implementations of the present technology will now be described, by way of example only, with reference to the attached figures.

DETAILED DESCRIPTION

Figure 1:
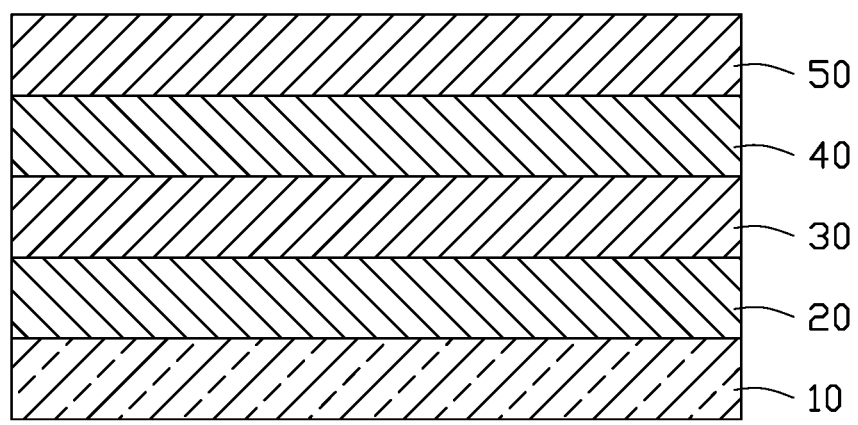
FIG. 1 is a cross-sectional view of a first step of a first exemplary embodiment of a method for making a flexible display device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

Figure 6:
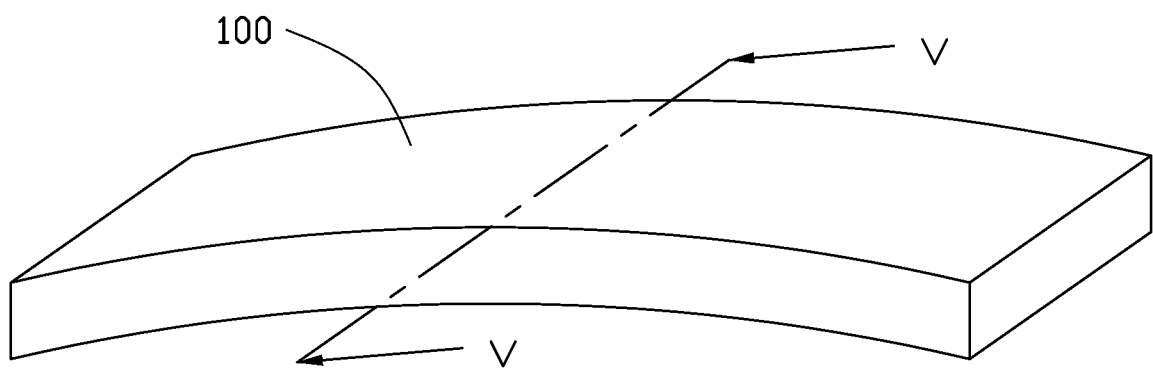
FIG. 6 is an isometric view of a flexible display device in the method of FIG. 1 according to an exemplary embodiment.
Figure 7:
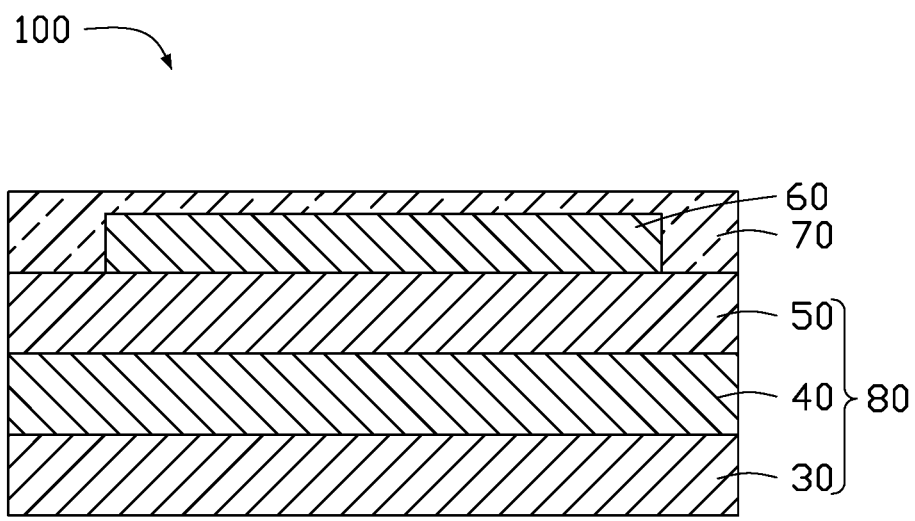
FIG. 7 is a cross-sectional view of the flexible display device along line V-V of FIG. 6.

FIG. 1 through FIG. 4 illustrate a method for making a flexible display device 100 (as shown in FIG. 6 and FIG. 7) according to an exemplary embodiment. In the present exemplary embodiment, the flexible display device 100 is an organic light emitting diode (OLED) display device. In other embodiments, the flexible display device 100 may be a liquid crystal display device.

A method for making the flexible display device 100 according to a first exemplary embodiment of the present disclosure includes the following steps.

Step S1: as shown in FIG. 1, a hard substrate 10 is provided, and a sacrificial layer 20, a metal layer 30, a buffer layer 40, and a flexible layer 50 are sequentially formed on a surface of the hard substrate 10. The sacrificial layer 20 is formed on the hard substrate 10; the metal layer 30 is formed on the sacrificial layer 20; the buffer layer 40 is formed on the metal layer 30; and the flexible layer 50 is formed on the buffer layer 40.

The hard substrate 10 can be made of a conventional transparent and hard material, such as glass, sapphire, and the like. In the present exemplary embodiment, the hard substrate 10 is made of a transparent glass. The hard substrate 10 is capable of allowing laser light to pass through.

The sacrificial layer 20 may be made of polyimide, polycrystalline silicon, monocrystalline silicon, or amorphous silicon. The sacrificial layer 20 has a thickness of about 10 microns to about 20 microns.

The metal layer 30 serves as an interface, facilitating the sacrificial layer 20 being peeled off. The metal layer 30 can be made of a metal or an alloy conventionally used in the field, such as titanium, titanium alloy, stainless steel, and the like. The metal layer 30 is thin enough to be flexible and bendable.

Figure 2:
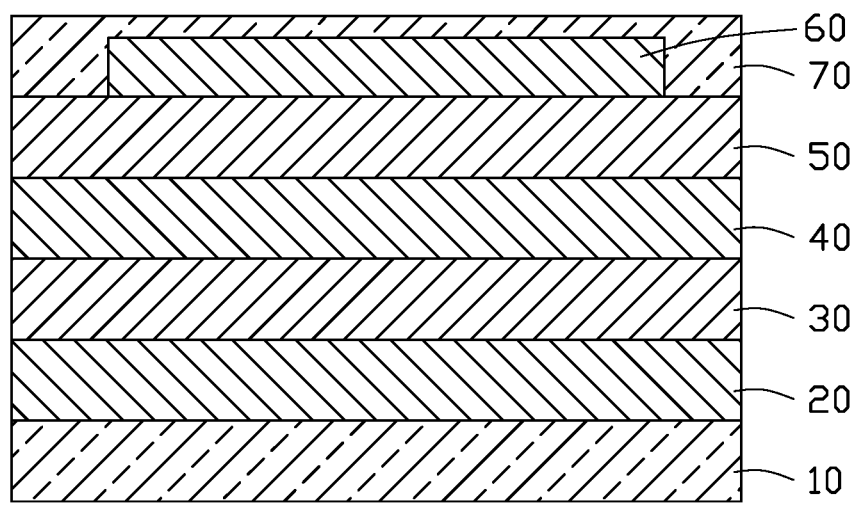
FIG. 2 is a cross-sectional view of a second step of the method for making a flexible display device.

The buffer layer 40 is configured to absorb laser that may pass through the sacrificial layer 20, thus the flexible layer 50 is protected from the laser. In additional, the buffer layer 40 prevents impurities (e.g. water and dust) into a display element layer 60 (as shown in FIG. 2). The buffer layer 40 is made of an inorganic material. For example, the buffer layer 40 may be made from one or more of silicon nitride, silicon oxide, silicon oxycarbide, silicon oxynitride, and silicon carbonitride.

The flexible layer 50 may be made of a polymer. In the present embodiment, both the sacrificial layer 20 and the flexible layer 50 are made of polyimide.

Step S2: as shown in FIG. 2, a display element layer 60 is formed on the flexible layer 50. The display element layer 60 is on a surface of the flexible layer 50 away from the buffer layer 40. The display element layer 60, the flexible layer 50, the buffer layer 40, the metal layer 30, the sacrificial layer 20, and the hard substrate 10 form a laminate.

Figure 5:
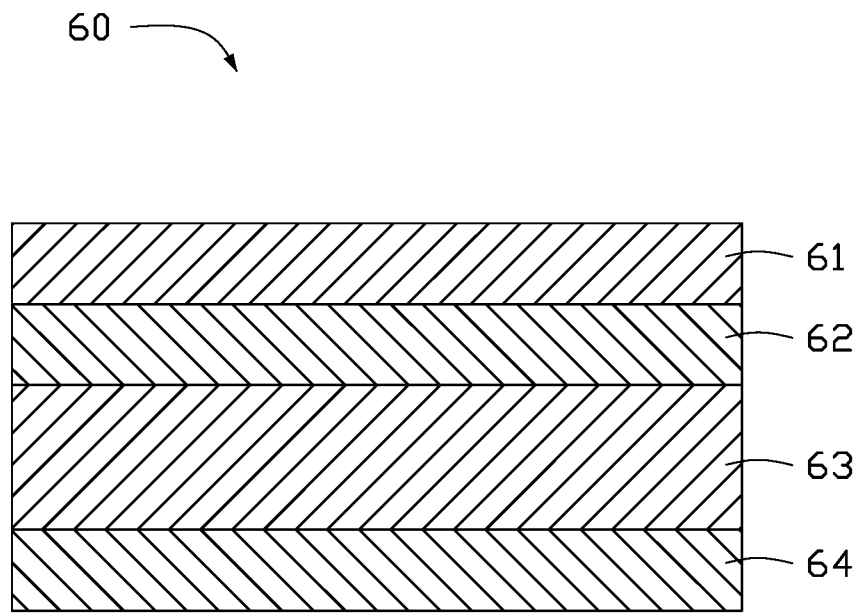
FIG. 5 is a cross-sectional view of a display element layer in the method of FIG. 1 according to an exemplary embodiment.

In the present exemplary embodiment, the display element layer 60 is a conventional OLED display element layer. As shown in FIG. 5, the display element layer 60 may include a TFT array layer 61, a anode layer 62 on the TFT array layer 61, an organic light-emitting layer 63 on the anode layer 62, and a cathode layer 64 on the organic light-emitting layer 63.

The step S2 may include: forming the TFT array layer 61 on the flexible layer 50, forming the anode layer 62 on the TFT array layer 61, forming the organic light-emitting layer 63 on the anode layer 62, and finally forming the cathode layer 64 on the organic light-emitting layer 63. The TFT array layer 61 is directly formed on the flexible layer 50. The TFT array layer 61 is configured to drive the organic light-emitting layer 63 to emit light. The TFT array layer 61 may include a plurality of data lines (not shown) parallel to each other, a plurality of scan lines (not shown) parallel to each other, and a plurality of thin film transistors (not shown). The data lines are electrically insulated from the scan lines, and the data lines cross the scan lines. The data lines and the scan lines define a plurality of pixel regions. At least one thin film transistor is located in each pixel region.

It is to be understood that the method may further include forming a protecting layer 70 on the display element layer 60 after the display element layer 60 has been formed on the flexible layer 50.

Figure 3:
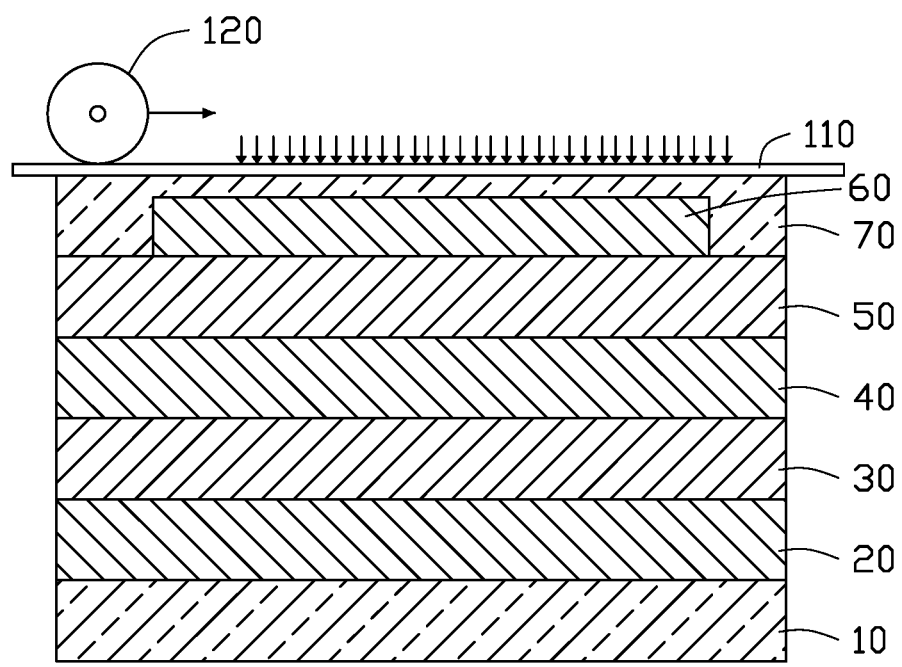
FIG. 3 is a cross-sectional view of a third step of the method for making a flexible display device.

Step S3: as shown in FIG. 3, the laminate is hot-pressed to firmly bond the display element layer 60 to the flexible layer 50.

As shown in FIG. 3, a protecting pad 110 and a pressing device 120 are used in the hot-press process. The ambient temperature of the hot-press process is kept at about 65 degrees Celsius to about 75 degrees Celsius, preferably 70 degrees Celsius. The protecting pad 110 is positioned on a side of the display element layer 60 away from the hard substrate 10, and the pressing device 120 is positioned above the protecting pad 110 to press the display element layer 60 to the flexible layer 50. The protecting pad 110 is configured to protect the display element layer 60 during the hot-press process. In the present exemplary embodiment, the pressing device 120 is a roller; and the protecting pad 110 is made of silicon rubber.

Figure 4:
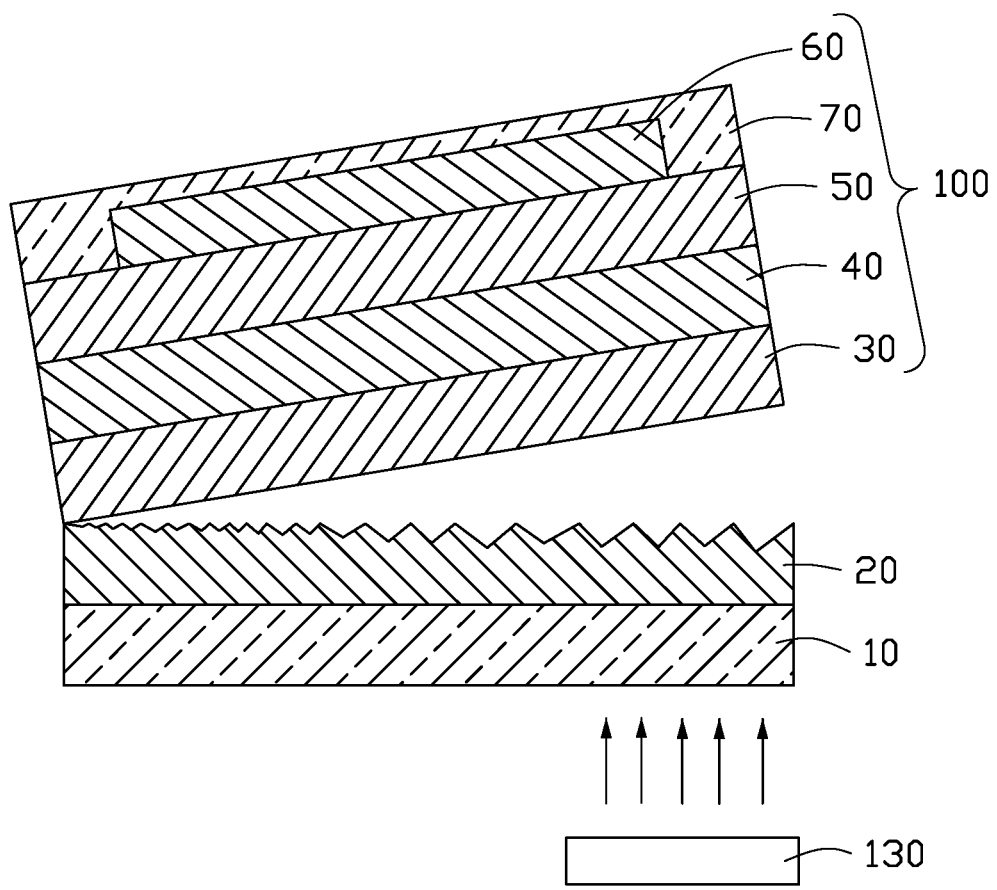
FIG. 4 is a cross-sectional view of a fourth step of the method for making a flexible display device.

Step S4: as shown in FIG. 4, the laminate is laser irradiated after being hot-pressed so that the sacrificial layer 20 and the metal layer 30 can be peeled away from each other. Finally, the display element layer 60, the flexible layer 50, the buffer layer 40, and the metal layer 30 cooperatively form the flexible display device 100.

As shown in FIG. 4, a laser source 130 is used in the laser irradiating process. The laser source 130 is positioned at a side of the hard substrate 10 away from the display element layer 60. Laser beams from the laser source 130 penetrate the hard substrate 10 and the sacrificial layer 20, and reach interface between the sacrificial layer 20 and the metal layer 30. The sacrificial layer 20 melts, decomposes, and becomes gaseous under the laser energy, thus the metal layer 30 is separated from the sacrificial layer 20. By using this peeling method, the metal layer 30 and the sacrificial layer 20 are peeled off from each other completely.

It is to be understood that the sacrificial layer 20 can be completely removed by the laser irradiating treatment.

In the event that a portion of the sacrificial layer 20 remains on the hard substrate 10 after the metal layer 30 is peeled off from the sacrificial layer 20, the hard substrate 10 may be cleaned and reused by removing the portion of the sacrificial layer 20 remaining on the hard substrate 10.

FIG. 6 through FIG. 7 illustrate a flexible display device 100 according to an exemplary embodiment. The flexible display device 100 includes a flexible substrate 80 and a display element layer 60 stacked on the flexible substrate 80. The flexible substrate 80 includes a metal layer 30, a buffer layer 40 stacked on the metal layer 30, and a flexible layer 50 stacked on the buffer layer 40. The display element layer 60 is located on a surface of the flexible layer 50 away from the buffer layer 40.

The metal layer 30 can be made of a metal or an alloy conventionally used in the field, such as titanium, titanium alloy, stainless steel, and the like. The metal layer 30 is flexible and bendable because it is thin.

The buffer layer 40 may be made of one or more of silicon nitride, silicon oxide, silicon oxycarbide, silicon oxynitride, and silicon carbonitride. The buffer layer 40 prevents impurities (e.g. water and dust) entering into a display element layer 60.

The flexible layer 50 may be made of a polymer. In the present embodiment, both the sacrificial layer 20 and the flexible layer 50 are made of polyimide.

In the present exemplary embodiment, the display element layer 60 is a conventional OLED display element layer. As shown in FIG. 5, the display element layer 60 may include a TFT array layer 61, a anode layer 62 on the TFT array layer 61, an organic light-emitting layer 63 on the anode layer 62, and an cathode layer 64 on the organic light-emitting layer 63. The TFT array layer 61 is directly formed on the flexible layer 50. The TFT array layer 61 is configured to drive the organic light-emitting layer 63 to emit light.

The TFT array layer 61 may include a plurality of data lines (not shown) parallel to each other, a plurality of scan lines (not shown) parallel to each other, and a plurality of thin film transistors (not shown). The data lines are electrically insulated from the scan lines, and the data lines cross the scan lines. The data lines and the scan lines define a plurality of pixel regions. At least one thin film transistor is located in each pixel region.

The flexible display device 100 may further include a protecting layer 70 on the display element layer 60. In the present exemplary embodiment, the protective layer 70 is formed on the flexible layer 50 and the display element layer 60 is located between the flexible layer 50 and the protective layer 70.

It is to be understood, even though information and advantages of the present exemplary embodiments have been set forth in the foregoing description, together with details of the structures and functions of the present exemplary embodiments, that the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A method for making a flexible display device comprising:
   providing a hard substrate and sequentially forming a sacrificial layer, a metal layer, a buffer layer, and a flexible layer on the hard substrate, the sacrificial layer being made of polyimide;
   forming a display element layer on a surface of the flexible layer away from the buffer layer, and then the display element layer, the flexible layer, the buffer layer, the metal layer, the sacrificial layer, and the hard substrate forming a laminate, the display element layer being configured to display images;
   hot pressing the laminate to make the display element layer to bond to the flexible layer; and laser irradiating the laminate from a side of the hard substrate to make the sacrificial layer to melt, decompose, and be peeled off from the metal layer.

2. The method for making a flexible display device of claim 1, wherein the hard substrate is capable of allowing laser to pass through.

3. The method for making a flexible display device of claim 2, wherein the hard substrate is made of a transparent glass.

4. The method for making a flexible display device of claim 1, wherein the buffer layer is made of one or more selected from a group consisting of silicon nitride, silicon oxide, silicon oxycarbide, silicon oxynitride, and silicon carbonitride.

5. The method for making a flexible display device of claim 1, wherein the display element layer is an OLED display element layer; forming the display element layer on the flexible layer comprises the following steps: forming a TFT array layer on the flexible layer, forming an anode layer on the TFT array layer, forming an organic light-emitting layer on the anode layer, and forming a cathode layer on the organic light-emitting layer.

6. The method for making a flexible display device of claim 1, wherein a pressing device is used during hot pressing the laminate, and an ambient temperature is kept at about 65 degrees Celsius to about 75 degrees Celsius during hot pressing the laminate.

7. The method for making a flexible display device of claim 6, wherein a protecting pad is used during hot pressing the laminate, and the protecting pad is positioned on a side of the display element layer away from the hard substrate.

8. The method for making a flexible display device of claim 7, wherein the pressing device is a roller; and the protecting pad is made of silicon rubber.

9. The method for making a flexible display device of claim 1, wherein a laser source is used during laser irradiating the laminate, and the laser source is positioned at a side of the hard substrate away from the display element layer.

10. The method for making a flexible display device of claim 1, wherein the sacrificial layer is made of polyimide, polycrystalline silicon, monocrystalline silicon, or amorphous silicon.

11. The method for making a flexible display device of claim 1, wherein the flexible display device comprises the display element layer, the flexible layer, the buffer layer, and the metal layer.

* * * * *